(12) United States Patent
Sadaka et al.

(10) Patent No.: US 9,034,727 B2
(45) Date of Patent: May 19, 2015

(54) METHODS AND STRUCTURES FOR FORMING INTEGRATED SEMICONDUCTOR STRUCTURES

(75) Inventors: Mariam Sadaka, Austin, TX (US); Radu Ionut, Crolles (FR)

(73) Assignee: SOITEC, Bernin (FR)

( * ) Notice: Subject to any disclaimer, the term of this patent is extended or adjusted under 35 U.S.C. 154(b) by 183 days.

(21) Appl. No.: 13/522,628

(22) PCT Filed: Jan. 4, 2011

(86) PCT No.: PCT/US2011/020100
§ 371 (c)(1),
(2), (4) Date: Jul. 17, 2012

(87) PCT Pub. No.: WO2011/097042
PCT Pub. Date: Aug. 11, 2011

(65) Prior Publication Data
US 2012/0292748 A1    Nov. 22, 2012

Related U.S. Application Data

(60) Provisional application No. 61/301,476, filed on Feb. 4, 2010.

(51) Int. Cl.
*H01L 21/30*    (2006.01)
*H01L 21/46*    (2006.01)
(Continued)

(52) U.S. Cl.
CPC .......... *H01L 25/50* (2013.01); *H01L 21/31053* (2013.01); *H01L 24/80* (2013.01);
(Continued)

(58) Field of Classification Search
USPC ................................... 438/455; 257/E21.567
See application file for complete search history.

(56) References Cited

U.S. PATENT DOCUMENTS

| 2006/0292744 A1 | 12/2006 | Enquist et al. |
| 2008/0006938 A1 | 1/2008 | Patti et al. |
| 2010/0155905 A1 | 6/2010 | Fukushima et al. |

FOREIGN PATENT DOCUMENTS

| JP | 2001332620 A | 11/2001 |
| KR | 1019990030756 A | 5/1999 |
| WO | 2009013849 A1 | 1/2009 |

OTHER PUBLICATIONS

Written Opinion of the International Searching Authority for International Application No. PCT/US2011/020100 mailed Apr. 21, 2011, 6 pages.

(Continued)

*Primary Examiner* — Thien F Tran
(74) *Attorney, Agent, or Firm* — TraskBritt

(57) ABSTRACT

The invention provides methods and structures for fabricating a semiconductor structure and particularly for forming a semiconductor structure with improved planarity for achieving a bonded semiconductor structure comprising a processed semiconductor structure and a number of bonded semiconductor layers. Methods for forming semiconductor structures include forming a dielectric layer over a non-planar surface of a processed semiconductor structure, planarizing a surface of the dielectric layer on a side thereof opposite the processed semiconductor structure, and attaching a semiconductor structure to the planarized surface of the dielectric layer. Semiconductor structures include a dielectric layer overlaying a non-planar surface of a processed semiconductor structure, and a masking layer overlaying the dielectric layer on a side thereof opposite the processed semiconductor structure. The masking layer includes a plurality of mask openings over conductive regions of the non-planar surface of the processed semiconductor structure.

19 Claims, 5 Drawing Sheets

(51) Int. Cl.
  *H01L 25/00* (2006.01)
  *H01L 21/3105* (2006.01)
  *H01L 25/065* (2006.01)
  *H01L 23/31* (2006.01)
  *H01L 23/00* (2006.01)

(52) U.S. Cl.
  CPC .............. *H01L2224/83894* (2013.01); *H01L 2924/01005* (2013.01); *H01L 2924/01013* (2013.01); *H01L 2924/01014* (2013.01); *H01L 2924/01015* (2013.01); *H01L 2924/01022* (2013.01); *H01L 2924/01027* (2013.01); *H01L 2924/01028* (2013.01); *H01L 2924/01029* (2013.01); *H01L 2924/0103* (2013.01); *H01L 2924/01032* (2013.01); *H01L 2924/01049* (2013.01); *H01L 2924/01051* (2013.01); *H01L 2924/01057* (2013.01); *H01L 2924/01073* (2013.01); *H01L 2924/01074* (2013.01); *H01L 2924/014* (2013.01); *H01L 2924/04941* (2013.01); *H01L 2924/04953* (2013.01); *H01L 2924/05042* (2013.01); *H01L 2924/14* (2013.01); *H01L 2924/01006* (2013.01); *H01L 2924/01023* (2013.01); *H01L 2924/01024* (2013.01); *H01L 2924/01033* (2013.01); *H01L 2924/01044* (2013.01); *H01L 2924/01072* (2013.01); H01L 25/0657 (2013.01); *H01L 2225/06513* (2013.01); *H01L 2225/06541* (2013.01); *H01L 2224/80894* (2013.01); H01L 23/3178 (2013.01); *H01L 24/05* (2013.01); *H01L 2224/0391* (2013.01); *H01L 2224/05571* (2013.01); *H01L 2224/05624* (2013.01); *H01L 2224/05647* (2013.01); *H01L 2224/05657* (2013.01); *H01L 2224/05676* (2013.01); *H01L 2224/05681* (2013.01); *H01L 2224/05686* (2013.01); *H01L 2224/08146* (2013.01)

(56) References Cited

OTHER PUBLICATIONS

Korean Preliminary Rejection for Korean Application No. 10-2012-7021182 dated Sep. 4, 2013, 10 pages including translation.

International Preliminary Report on Patentability and Written Opinion for International Application No. PCT/US2011/020100 dated Aug. 7, 2012, 5 pages.

Choi et al. "The analysis of Oxygen Plasma Pretreatment for Improving Anodic Bonding," Journal of Electrochemical Society, vol. 149, No. 1, pp. G8 G11 (2002).

Christiansen et al., Wafer Direct Bonding: From Advanced Substrate Engineering to Future Applications in Micro/Nanoelectronics, Proceedings of the IEEE, vol. 94, No. 12, pp. 2060-2106 (2006).

International Search Report for International Application No. PCT/US2011/020100 mailed Apr. 21, 2011, 3 pages.

Joshi et al., A new Damascene structure for submicrometer wiring, IEEE Electron Device Letters, vol. 14, No. 3, pp. 129 132 (1993).

Tong et al., Semiconductor wafer bonding: recent developments, Materials, Chemistry and Physics, vol. 37, pp. 101-127 (1994).

METHODS AND STRUCTURES FOR FORMING INTEGRATED SEMICONDUCTOR STRUCTURES

CROSS REFERENCE TO RELATED APPLICATIONS

This is a national phase entry under 35 U.S.C. §371 of International Patent Application PCT/US2011/020100, filed Jan. 4, 2011, published in English as International Patent Publication WO 2011/097042 A1 on Aug. 11, 2011, which claims the benefit under Article 8 of the Patent Cooperation Treaty to U.S. Provisional patent application Ser. No. 61/301,476, filed Feb. 4, 2010, the disclosures of each of which applications is hereby incorporated herein by this reference in its entirety.

FIELD

The various embodiments of the present invention generally relate to methods and structures for forming semiconductor structures and, more particularly, to methods and structures for forming planar surfaces on semiconductor structures for attachment of additional semiconductor structures thereto.

BACKGROUND

The three-dimensional (3D) integration of two or more semiconductor structures may be beneficial in microelectronic applications. For example, 3D integration of microelectronic devices may result in improved electrical performance and power consumption while reducing the overall device foot print. See, for example, the publication of P. Garrou et al., 2008, entitled *The Handbook of 3D Integration*, Wiley-VCH.

The 3D integration of semiconductor structures may be achieved by a number of methods, including, for example, the attachment of one or more semiconductor structures to a processed semiconductor structure that comprises a plurality of device structures. The attachment of a semiconductor structure to a processed semiconductor structure may be achieved by a number of methods. Upon attaching the semiconductor structure to the processed semiconductor structure, the semiconductor structure may undergo additional processes, and may itself be used as a receiving substrate for the attachment of further semiconductor structures. It should be noted that the 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

However, the smoothness and the planarity of each of the structures to be attached to one another, e.g., the attachment surfaces of the processed semiconductor structure and the semiconductor structures may have an affect on the quality of the completed 3D integrated semiconductor structure. For example, when the 3D integration of a structure comprises a processed semiconductor structure in which semiconductor devices have been formed, the processes used to form the semiconductor devices may result in rough non-planar surfaces. Subsequent attachment of a semiconductor structure to a rough non-planar surface of the processed semiconductor structure may result in poor adhesion between the semiconductor structure and the processed semiconductor structure, which may result in an undesirable separation of the semiconductor structure from the processed semiconductor structure during subsequent processes.

BRIEF SUMMARY

The various embodiments of the present invention generally provide methods and structures for forming semiconductor structures and, more particularly, to methods and structures for forming smooth planar surfaces on semiconductor structures for attachment of additional semiconductor structures thereto. The methods are now briefly described in terms of embodiments of the invention. This summary is provided to introduce a selection of concepts in a simplified form that are further described in the detailed description of the embodiments of the invention. This summary is not intended to identify key features or essential features of the claimed subject matter, nor is it intended to be used to limit the scope of the claimed subject matter.

Therefore, in some embodiments of the invention, methods of forming semiconductor structures include forming a dielectric layer over a non-planar surface of a processed semiconductor structure. The non-planar surface of the processed semiconductor structure may include a plurality of conductive regions and a plurality of non-conductive regions. A masking layer is formed over the dielectric layer, and a plurality of mask openings are provided that extend through the masking layer directly over at least some of the conductive regions of the plurality of conductive regions of the non-planar surface of the processed semiconductor structure. A surface of the dielectric layer on a side thereof opposite the non-planar surface of the processed semiconductor structure may be planarized to form a planarized surface. Planarizing the surface of the dielectric layer may include etching regions of the dielectric layer exposed through the plurality of mask openings, and polishing the surface of the dielectric layer after the etching of the regions of the dielectric layer. A semiconductor structure then may be attached to the planarized surface of the dielectric layer.

The various embodiments of the invention may also include structures formed by the methods described herein. For example, in some embodiments, semiconductor structures include a dielectric layer overlaying a non-planar surface of a processed semiconductor structure. The non-planar surface comprises a plurality of conductive regions and a plurality of non-conductive regions. The semiconductor structures may also include a masking layer overlaying the dielectric layer on a side thereof opposite the processed semiconductor structure. The masking layer may comprise a plurality of mask openings extending through the masking layer directly over at least some of the plurality of conductive regions of the non-planar surface of the processed semiconductor structure.

Further aspects, details and alternate combinations of the elements of this invention will be apparent from the following detailed description and are also within the scope of the invention.

BRIEF DESCRIPTION OF THE DRAWINGS

The present invention may be understood more fully by reference to the following detailed description of example embodiments of the present invention, which are illustrated in the appended figures, in which.

DETAILED DESCRIPTION

The illustrations presented herein are not meant to be actual views of any particular structure, material, apparatus, system, or method, but are merely idealized representations that are employed to describe embodiments of the present invention.

Headings are used herein for clarity only and without any intended limitation to the scope of the appended claims. A number of references are cited herein, the disclosures of which are incorporated herein, in their entirety, by this reference for all purposes. Further, none of the cited references, regardless of how characterized herein, is admitted as prior art relative to the invention of the subject matter claimed herein.

As used herein, the term "semiconductor structure" means and includes any structure comprising semiconductor material, including bulk semiconductor materials such as a semiconductor wafer (either alone or in assemblies comprising other materials thereon), and semiconductor material layers (either alone or in assemblies comprising other materials such as metals and insulators). In addition, the term "semiconductor structure" also includes any supporting structure including, but not limited to, the semiconductor structures described above. The term "semiconductor structure" may also refer to one or more semiconductor layers or structures that include active or operable portions of semiconductor devices, as well as semiconductor structures during processing (and may include other layers, such as silicon-on-insulator (SOI), etc., that have been fabricated thereupon).

As used herein, the term "processed semiconductor structure" means and includes a semiconductor structure to which various process treatments have been applied.

As used herein, the term "device structure" means and includes any structure comprising active or passive device components intended to be incorporated into a semiconductor device.

As used herein, the term "bonded structure" means and includes two or more semiconductor structures attached to one another through an attachment process.

By way of introduction to embodiments of the present invention, FIGS. 1A-1C and FIGS. 2A-2C illustrate previously known methods of attaching a semiconductor structure to a processed semiconductor structure, and the semiconductor structures formed during such methods.

Figure 1A:
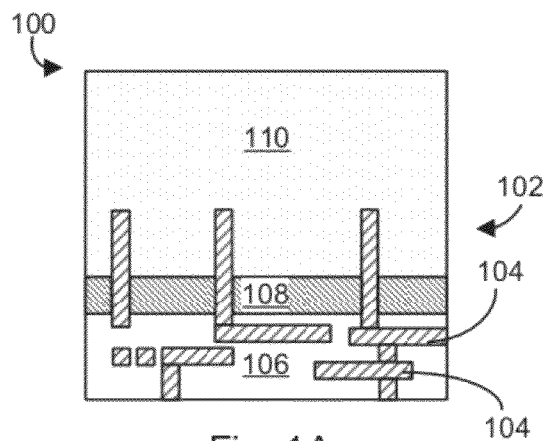
FIGS. 1A-1C schematically illustrate a previously known technique for attaching a semiconductor structure to a processed semiconductor structure.

FIG. 1A illustrates semiconductor structure 100 comprising processed semiconductor structure 102. The processed semiconductor structure may include a plurality of electrically conducting regions 104, dielectric layer 106, device layer 108 and device substrate 110. The plurality of conducting regions 104 may comprise a number of subregions, such subregions comprising, for example, barrier subregions, electrode subregions and via subregions. The plurality of conducting regions 104 may comprise one or more materials such as, for example, cobalt, ruthenium, nickel, tantalum, tantalum nitride, indium oxide, tungsten, tungsten nitride, titanium nitride, copper and aluminum.

Dielectric layer 106 is electrically insulating and may comprise one or more dielectric materials, such as, for example, polyimides, benzocyclobutene (BCB), boron nitrides, boron carbide nitrides, porous silicates, silicon oxides, silicon nitrides and mixtures thereof. Furthermore, the dielectric layer 106 may comprise a plurality of layers of dielectric material, some of which layers may have a material composition differing from one or more other layers of dielectric material forming the dielectric layer 106.

Device layer 108 may comprise a plurality of device structures, such as, for example, one or more of switching structures (e.g., transistors, etc.), light-emitting structures (e.g., laser diodes, light-emitting diodes, etc.), light-receiving structures (e.g., waveguides, splitters, mixers, photodiodes, solar cells, solar subcells, etc.), and microelectromechanical structures (e.g., accelerometers, pressure sensors, etc). In some embodiments of the invention, device layer 108 may comprise one or more of metal-oxide-semiconductor (CMOS) integrated circuits, transistor-transistor logic integrated circuits and NMOS logic integrated circuits.

Device substrate 110 may comprise any of a number of materials, such as, for example, one or more of silicon, germanium, silicon carbide, III-arsenides, III-phosphides, III-nitrides, III-antimonides, sapphire, quartz and zinc oxide. Furthermore, the device substrate 110 may comprise a plurality of layers of such materials, some of which layers may have differing material compositions.

Figure 1B:
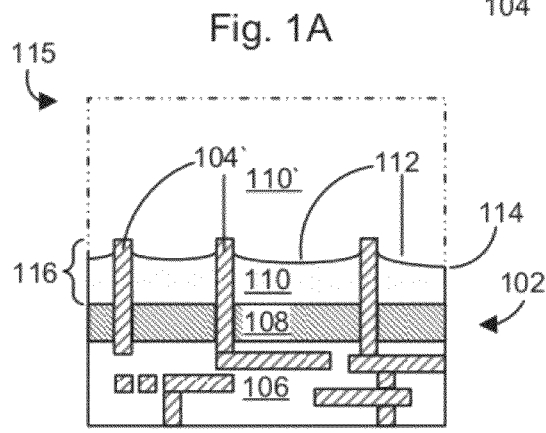

FIG. 1B illustrates a semiconductor structure 115 that may be formed by removing a portion 110' of device substrate 110 from the semiconductor structure 100 of FIG. 1A (the portion 110' being shown in phantom in FIG. 1B). A portion 110' of device substrate 110 may be removed to thin the device substrate 110 and to expose a plurality of conducting regions 104' through the material of the device substrate 110. The conducting regions 104' may be or include what are referred to in the art as "through silicon vias" or "through substrate vias" (TSVs), and may provide electrical connections between the device layer 108, through the device substrate 110, to another semiconductor structure to be subsequently attached to semiconductor structure 115. A portion 110' of device substrate 110 may be removed by methods such as, for example, polishing, grinding, etching, and combinations of such methods (e.g., chemical mechanical polishing).

As illustrated in FIG. 1B, the removal of a portion 110' of device substrate 110 may result in a plurality of eroded regions 112 that comprise valleys in the material of the device substrate 110. The eroded regions 112 may result in the processed semiconductor structure 102 having a non-planar surface 114. Section 116 of processed semiconductor structure 102 includes the non-planar surface 114 of processed semiconductor structure 102. As shown in FIG. 1B, the non-planar surface 114 of the processed semiconductor structure comprises a plurality of conductive regions 104' and a plurality of non-conductive regions defined by and comprising regions of the device substrate 110. In some embodiments, the conductive regions 104' may comprise metallic regions, and the non-conductive regions may comprise non-metallic regions.

Figure 1C:
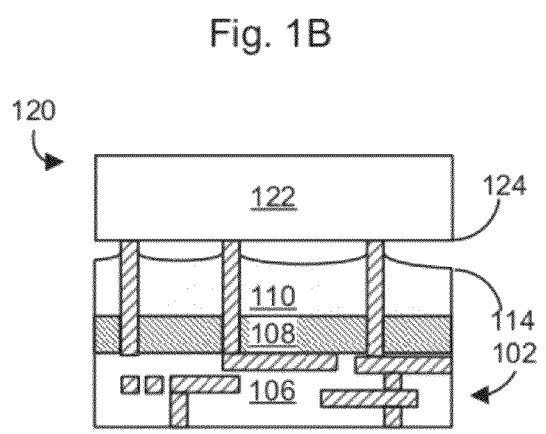

FIG. 1C illustrates a semiconductor structure 120 that may be formed by attaching another semiconductor structure 122 to the non-planar surface 114 of the semiconductor structure 115 of FIG. 1B. Semiconductor structure 122 may be attached via bonding to the processed semiconductor structure 102 along a bonding interface 124 between the non-planar surface 114 of the processed semiconductor structure 102 and an adjacent surface of the semiconductor structure 122. As a result of non-planar surface 114, bonding interface 124 may be discontinuous. In other words, the bonding interface 124 may comprise bonded and unbonded regions. In addition, the plurality of eroded regions 112, which may result from processes used to remove a portion 110' of the device substrate 110 may result in a plurality of unbonded regions. Due to the presence of unbonded areas between semiconductor structure 122 and processed semiconductor structure 102, the bond strength there between may be insufficient for additional operations, for example, such as handling and supplementary processing.

Figure 2A:
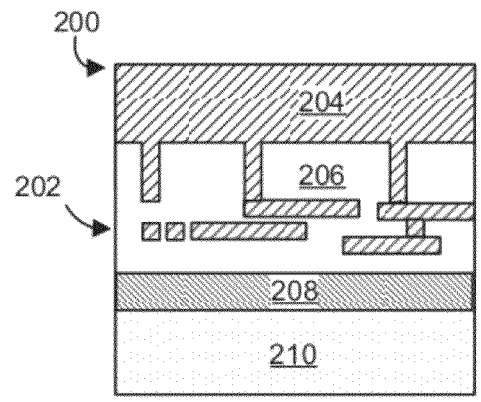
FIGS. 2A-2C schematically illustrate another previously known technique for attaching a semiconductor structure to a processed semiconductor structure.
Figure 2B:
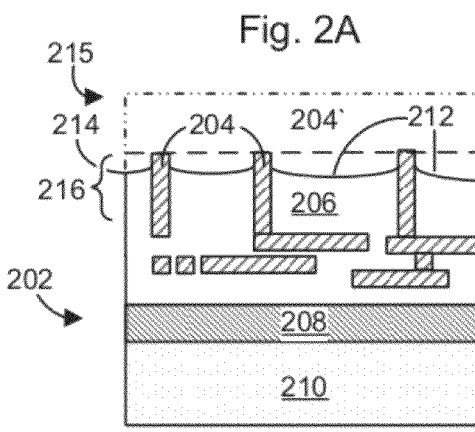
Figure 2C:
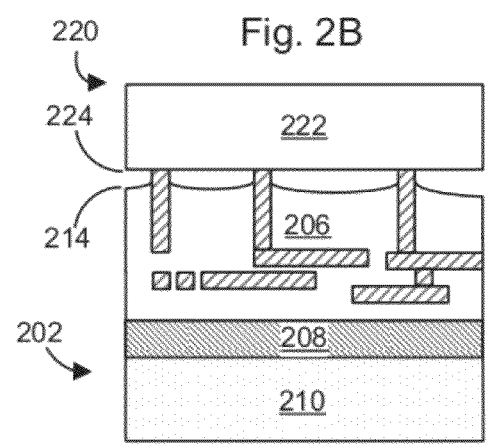

FIGS. 2A-2C illustrate another previously known technique for attaching a semiconductor structure to a processed semiconductor structure. FIG. 2A illustrates semiconductor structure 200 comprising processed semiconductor structure 202. Processed semiconductor structure 202 may include conducting regions 204, dielectric layer 206, device layer 208 and device substrate 210. The processed semiconductor structure 202 and its constituent elements may comprise all the materials and structures described above in relation to FIGS. 1A-1C.

FIG. 2B illustrates a semiconductor structure 215 that may be formed by removing a portion 204' of conducting region 204 from the semiconductor structure 200 of FIG. 2A (the portion 204' being shown in phantom in FIG. 2B). A portion 204' of conducting layer 204 may be removed to produce a plurality of conducting regions 204. The plurality of conducting regions 204 may provide electrical connections to a plurality of device structures present within device substrate 208. A portion 204' of conducting layer 204 may be removed by methods such as, for example, polishing, grinding, etching, and combinations of such processes (e.g., chemical mechanical polishing). In some embodiments, the plurality of conducting regions 204 may be formed using methods commonly referred to in the art as "Damascene" methods. Such methods are described in further detail in, for example, Joshi et al., "A new Damascene structure for submicrometer wiring," *IEEE Electron Device Letters*, Volume 14, No. 3, pages 129-132, 1993.

As illustrated in FIG. 2B, the removal of a portion 204' of conducting layer 204 may result in the removal of portions of dielectric layer 206. The removal or "erosion" of portions of dielectric layer 206 may produce a plurality of eroded regions 212, and may result in the processed semiconductor structure having a non-planar surface 214. Section 216 of processed semiconductor structure 202 comprises non-planar surface 214. Non-planar surface 214 may comprise a plurality of conductive regions 204 and a plurality of non-conductive regions 206. In some embodiments, the plurality of conductive regions 204 may comprise a plurality of metallic regions, and the plurality of non-conductive regions 206 may comprise a plurality of non-metallic regions.

FIG. 2C illustrates a semiconductor structure 220 that may be formed by attaching another semiconductor structure 222 to the non-planar surface 214 of the processed semiconductor structure 202 of the semiconductor structure 215 of FIG. 2B. Semiconductor structure 222 may be attached via bonding to processed semiconductor structure 202 at a bonding interface 224 between the non-planar surface 214 of the processed semiconductor structure 202 and an adjacent surface of the semiconductor structure 222. As discussed above, the non-planar surface 214 of the processed semiconductor structure 202 may result in a discontinuous bonding interface 224, which may adversely affect the bond strength achieved between the processed semiconductor structure 202 and the semiconductor structure 222, and may render the bond strength insufficient for additional operations to be performed on the semiconductor structure 220.

Embodiments of the invention may comprise methods and structures for forming semiconductor structures that improve the planarity of the surface of a processed semiconductor structure in order to allow attachment of a semiconductor structure thereto. Such methods and structures may be utilized for various purposes, such as, for example, producing 3D integration processes and 3D integrated structures.

Figure 3A:
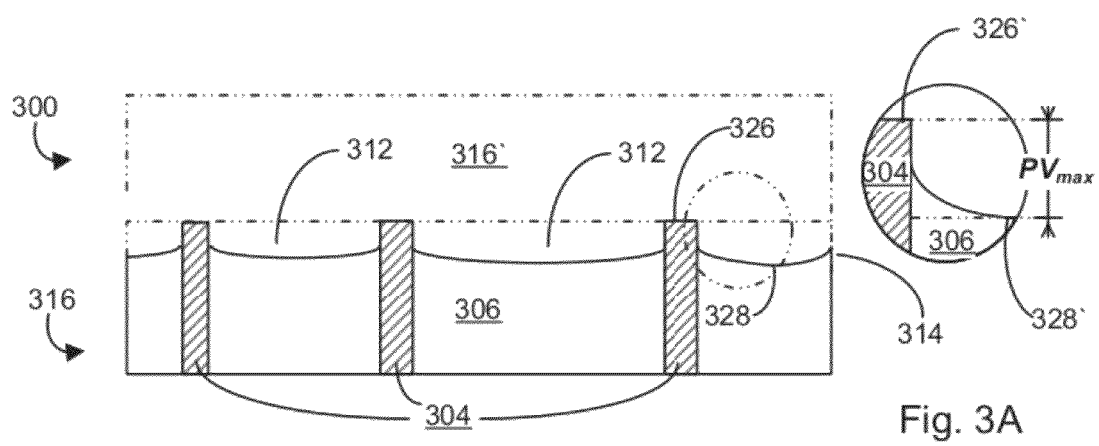
FIGS. 3A-3F schematically illustrate embodiments of the invention for forming 3D integrated semiconductor structures.

Example embodiments of the invention are described below with reference to FIGS. 3A-3F. FIG. 3A illustrates semiconductor structure 300, which comprises non-planar surface 314 of a processed semiconductor structure 316. The non-planar surface 314 may comprise a plurality of conductive regions 304 (e.g., metallic regions) and a plurality of non-conductive regions 306 (e.g., non-metallic regions). As non-limiting examples, semiconductor structure 300 may comprise section 116 of FIG. 1B or section 216 of FIG. 2B. It should, therefore, be noted that semiconductor structure 300 may comprise a processed semiconductor structure 316 that includes a number of processed semiconductor structure elements, which are omitted from the figures for clarity.

The plurality of non-conductive regions 306 may be part of a device substrate, such as, for example, the device substrate 110 in the example of FIG. 1B. The device substrate may comprise one or more homogenous or heterogeneous semiconductor layers, and may comprise any of a number of materials. For example, the device substrate may comprise one or more of silicon, germanium, silicon carbide, III-arsenides, III-phosphides, III-nitrides, III-antimonides, sapphire, quartz and zinc oxide. The device substrate may also comprise a plurality of device structures, as previously discussed above. Such device structures may include, for example, one or more of metal-oxide-semiconductor (CMOS) integrated circuits, transistor-transistor logic integrated circuits and NMOS logic integrated circuits.

The plurality of non-conductive regions 306 of semiconductor structure 300 may be part of a dielectric layer, such as, for example, the dielectric layer 206 in the example of FIG. 2B. The dielectric layer may comprise one or more layers of dielectric material, and may comprise any of a number of materials, such as, for example, polyimides, benzocyclobutene (BCB), boron nitrides, boron carbide nitrides, porous silicates, silicon oxides, silicon nitrides and mixtures thereof.

The plurality of conductive regions 304 of semiconductor structure 300 may comprise a number of subregions, such subregions may comprise, for example, barrier subregions and electrode subregions. In addition, conducting regions 304 may comprise any of a number of materials such as, for example, one or more of cobalt, ruthenium, tantalum, tantalum nitride, indium oxide, tungsten nitride, titanium nitride, copper and aluminum.

The removal of a portion 316' of processed semiconductor structure 316 of semiconductor structure 300, as shown by the phantom region in FIG. 3A and described in detail above, may result in the formation of a plurality of eroded regions 312. For example, in some embodiments, the removal of a portion 316' of processed semiconductor structure 316 may involve the removal of a portion of a device substrate, such as the device substrate 110 illustrated in FIG. 1B. In other embodiments of the invention, the removal of a portion 316' of processed semiconductor structure 316 may involve the removal of a portion of a conducting layer, such as the conducting layer 204 illustrated in FIG. 2B. Independent of the material being removed from the processed semiconductor structure 316, the removal may result in the formation of a plurality of eroded regions 312, which may result in the formation of non-planar surface 314. In certain embodiments of the invention, the non-planar surface 314 of the processed semiconductor structure may be formed by a polishing process, such as, for example, a chemical mechanical polishing process.

The topology of non-planar surface 314 comprises a plurality of peak regions 326 and a plurality of valley regions 328. The plurality of eroded regions 312 may comprise or define the plurality of valley regions 328 (i.e., low lying regions of non-planar surface 314), and the regions of the non-planar surface 314 that do not comprise the plurality of eroded regions 312 may comprise or define the plurality of peak regions 326. The maximum peak-to-valley distance may be defined as the maximum vertical distance between the lowest lying valley region 328 and the highest lying peak region 326. For example, inset of FIG. 3A illustrates lowest lying valley region 328' and highest lying peak region 326' of non-planar surface 314. The vertical distance between peak region 326' and valley region 328' may be defined as the maximum peak-to-valley distance $PV_{max}$.

Figure 3B:
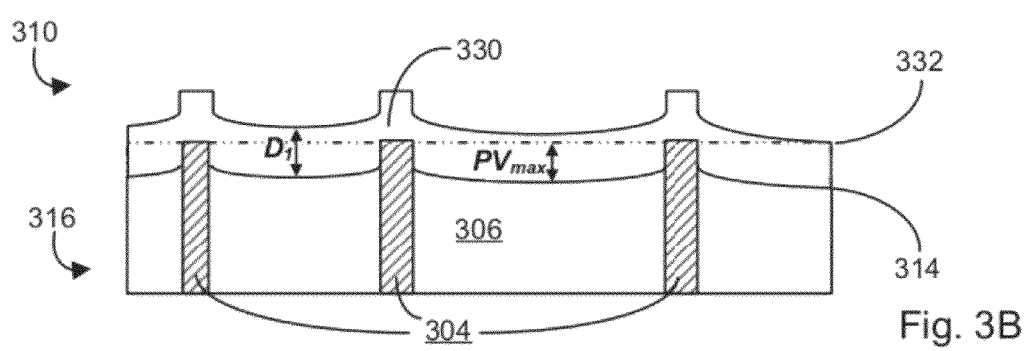

FIG. 3B illustrates a semiconductor structure 310 that may be formed by providing a dielectric layer 330 over the processed semiconductor structure 316 of FIG. 3A. Dielectric layer 330 overlays non-planar surface 314 and has an average layer thickness $D_1$. Dielectric layer 330 may comprise one or more dielectric materials such as, for example, silicon oxides, silicon nitrides and mixtures thereof. In some embodiments, the dielectric layer 330 may comprise a plurality of layers of dielectric material. In such embodiments, the dielectric materials of the layers may have similar or different compositions.

Dielectric layer 330 may be formed to overlay all or a portion of non-planar surface 314 utilizing a number of methods. For example, dielectric layer 330 may be formed utilizing deposition methods, such as, for example, chemical vapor deposition (CVD). A number of CVD methods are known in the art and may be used to produce dielectric layer 330. Such CVD methods include, for example, atmospheric pressure CVD (APCVD), low-pressure CVD (LPCVD) and ultrahigh vacuum CVD (UHCVD). In some embodiments of the invention, dielectric layer 330 may be formed utilizing low temperature CVD methods, such methods may include, for example, plasma-assisted CVD methods, such as, for example, sub-atmospheric CVD (SACVD), microwave plasma-assisted CVD (MPCVD), plasma-enhanced CVD (PECVD) and remote plasma-enhanced CVD (RPECVD). Plasma-assisted CVD methods for deposition of dielectric layer 330 may be utilized in some embodiments of the invention to provide a low temperature deposition process. A low temperature deposition process may be utilized in order to prevent degradation of a plurality of device structures, which may be present within processed semiconductor structure 316.

In more detail, processed semiconductor structure 316 may comprise a plurality of device structures that may be damaged if the deposition temperature of dielectric layer 330 is above a critical temperature for the on-set of device degradation. Therefore, in some embodiments of the invention, dielectric layer 330 may be formed at a temperature of less than about 600° C., at a temperature less than about 500° C., or at a temperature less than about 400° C.

As illustrated in FIG. 3B, dielectric layer 330 may be deposited conformally over non-planar surface 314 of processed semiconductor structure 316. Conformal deposition of dielectric layer 330 may be utilized in order to plug (i.e., fill or seal) the plurality of eroded regions 312, i.e., to fill the eroded regions 312 of non-planar surface 314. However, the use of a conformal deposition process to plug the plurality of eroded regions 312 may result in a dielectric layer 330 having a non-planar surface 332, since the conformal film may have a thickness that is substantially uniform throughout the extent of the dielectric layer 330. In other words, the material of the dielectric layer 330 may substantially preserve the topography of the underlying non-planar surface 314.

In some embodiments of the invention, dielectric layer 330 may have an average layer thickness $D_1$ greater than the maximum peak-to-valley distance $PV_{max}$. The average layer thickness $D_1$ may be selected to be greater than $PV_{max}$ so that the eroded regions 312 may be substantially plugged by the dielectric layer 330.

Figure 3C:
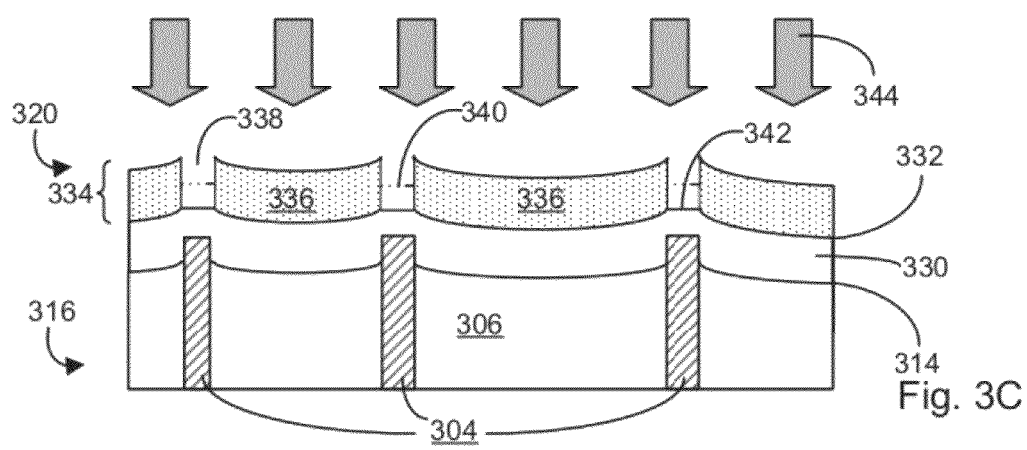

FIG. 3C illustrates a semiconductor structure 320 that may be formed by providing an etch masking layer 334 over the dielectric layer 330 of the semiconductor structure 310 of FIG. 3B. Etch masking layer 334 may include one or more etch masking regions 336 and a plurality of etch mask openings 338 that extend through the etch masking layer 334. The plurality of etch mask openings 338 may overlay a plurality of conductive regions 304 of the non-planar surface 314 of the processed semiconductor structure 316. In other words, the etch mask openings 338 may be aligned with, and disposed directly over, the conductive regions 304 of the non-planar surface 314. In contrast, the plurality of etch masking regions 336 may be located directly over a plurality of the non-conductive regions 306 of the non-planar surface 314.

In greater detail, upon formation of dielectric layer 330, non-planar surface 332 of the dielectric layer 330 may be selectively masked utilizing etch masking layer 334, as illustrated in FIG. 3C. Etch masking layer 334 may be produced using known processes in the art. For example, techniques such as those utilizing photosensitive chemicals and photolithography, as well as deposition of masking materials and patterned etching of the masking materials. Masking materials utilized to form the etch masking layer 334 (i.e., the plurality of etch masking regions 336) may comprise, for example, photosensitive polymers (e.g., polymethylmethacrylate, diazonaphthoquinone, etc.), dielectrics (e.g., silicon oxides, silicon nitrides, etc.) and metallic materials (e.g., titanium, nickel, chromium, etc.).

The patterning of etch masking layer 334 such that the plurality of etch mask openings 338 overlay (e.g., are aligned with and disposed directly over) the conductive regions 304 may comprise forming a negative image of the plurality of conductive regions 304 in the masking material of etch masking layer 334. The negative image of the plurality of conductive regions 304 may be formed in etch masking layer 334 by a number of methods. For example, the etch masking layer 334 may be formed using photolithography. In such embodiments, a photosensitive polymer may be used to form the etch masking layer 334. As known in the art, a layer of photosensitive polymer may be deposited in an unpolymerized and/or uncross-linked state, selectively exposed to electromagnetic radiation through an optical mask to polymerize and/or cross-link selected areas of the layer of photosensitive polymer, and then subsequently developed to remove portions of the layer of photosensitive polymer. As known in the art, the photosensitive polymer material may comprise a positive or negative photoresist material, and the pattern of the optical mask (i.e., a positive pattern or a negative pattern) is selected based on whether the photoresist material is a positive or negative photoresist material. Furthermore, the photoresist material may have image reversal capability (e.g., capable of converting between a positive and negative image), as known in the art. Such techniques may be used to form or pattern the etch masking layer 334 to comprise the plurality of etch mask openings 338 therein at locations that at least substantially correspond to the locations of the underlying plurality of conductive regions 304. In other words, the pattern of the etch mask opening 338 may at least substantially correspond to the pattern of the underlying plurality of conductive regions 304, and the etch mask opening 338 may be aligned with and located directly over the conductive regions 304.

Etch masking layer 334 may be utilized to protect selected areas of dielectric layer 330 from an etchant during an etch process, while at the same time exposing other regions of dielectric layer 330 to the etchant through the plurality of etch mask openings 338. As a result, material may be removed from the regions of the dielectric layer 330 exposed through the etch mask openings 338, which regions may comprise the plurality of peak regions 326. Thus, as the peak regions 326 are etched during an etch process, while the valley regions 328 are protected from the etch process by the etch masking layer 334, the planarity of the dielectric layer 330 may be improved. FIG. 3C illustrates the selective etching of dielectric layer 330, wherein the phantom line 340 represents the original position of the dielectric layer 330 prior to etching, and line 342 represents the position of the dielectric layer 330 during or after the selective etching process.

The selective etching of dielectric layer 330 through the plurality of mask openings 338 may be achieved utilizing methods such as, for example, wet chemical etching techniques or dry etching techniques. In certain embodiments of the invention, a dry etching technique such as an anisotropic plasma etching process may be utilized, as indicated by plasma etching arrows 344 in FIG. 3C. Such plasma etching techniques may include one or more of reactive ion etching (RIE), inductively coupled plasma etching (ICP), and electron cyclotron resonance etching (ECR), among others.

The particular chemical composition of the etchant used to remove portions of dielectric layer 330 may be selected such that plasma etchant 344 is selective to dielectric layer 330 over etch masking regions 336. In other words, the plasma etchant 344 may etch away the material of the dielectric layer 330 at a rate significantly higher than any rate at which the plasma etchant 344 etches away the material of the etch masking regions 336. Such a selection may be based on the composition of the material of the etch masking regions 336 and the material of the dielectric layer 330. As a non-limiting example, the dielectric layer 330 may comprise a silicon oxide, silicon nitride, or a mixture thereof, which materials may be etched selectively over a masking material comprising, for example, a photosensitive polymer, utilizing plasma generated from gas chemistries comprising fluorine species (e.g., $CHF_4$, $SF_6$, and $CF_4$).

Figure 3D:
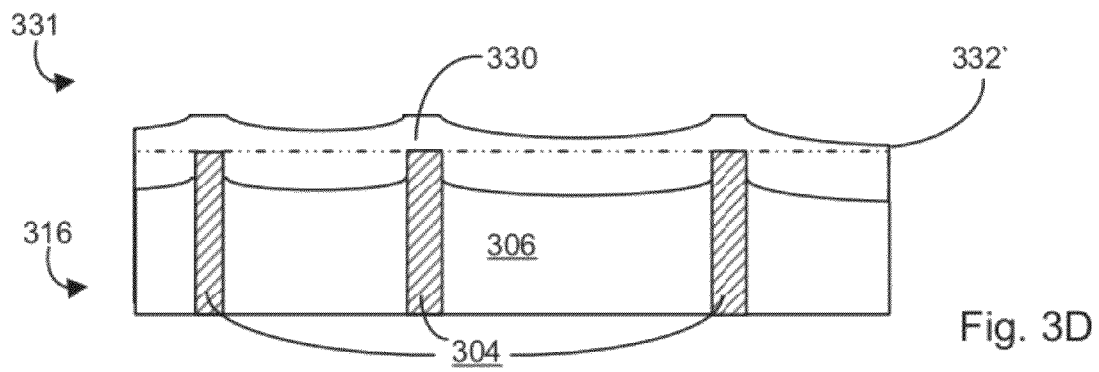

FIG. 3D illustrates a semiconductor structure 331 that may be formed by removing the etch masking regions 336 of the etch masking layer 334 from the semiconductor structure 320 of FIG. 3C after etching the dielectric layer 330 through the etch mask openings 338, as described above. Upon removal of the etch masking regions 336, the dielectric layer 330 may have a substantially planar surface 332' on a side thereof opposite the processed semiconductor structure 316. The planarity of the substantially planar surface 332' may be substantially improved relative to the planarity of the surface 332 (FIG. 3B) of the dielectric layer 330 prior to the etching process described in relation to FIG. 3C. The planarity of surface 332' of dielectric layer 330 may be sufficient for bonding to a further semiconductor structure to be subsequently attached thereto. However, in certain embodiments of the invention, surface 332' of dielectric layer 330 may be further processed to achieve a surface with sufficient planarity for achieving a suitable bond strength with a further semiconductor structure to be subsequently attached thereto.

Figure 3E:
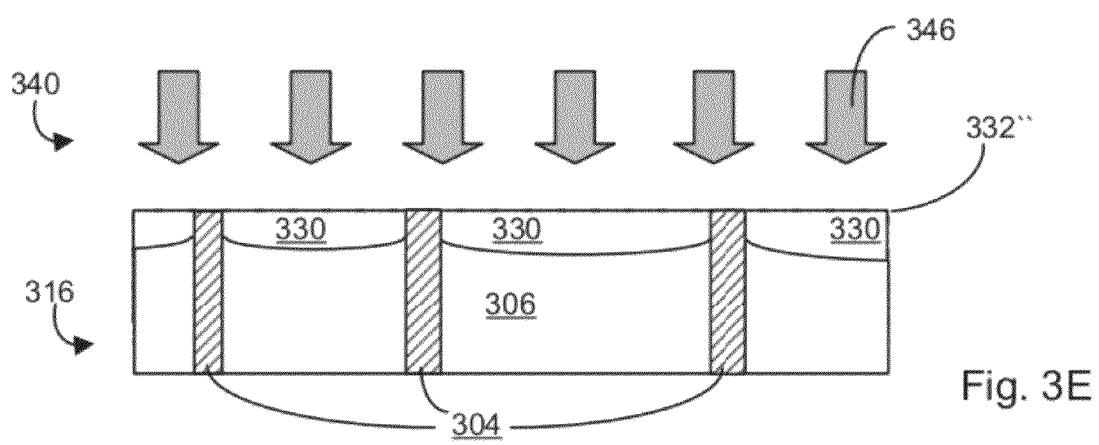

FIG. 3E illustrates a semiconductor structure 340 that may be formed by subjecting the surface 332' of the dielectric layer 330 of the semiconductor structure 331 of FIG. 3D to one or more planarization processes to further improve the planarity of the surface of the dielectric layer 330. The one or more planarization processes may be utilized in order to produce at least substantially planar surface 332" of the dielectric layer 330, which may have a planarity suitable for subsequent attachment to a further semiconductor structure.

In greater detail, a number of methods are known in the art for producing the planarized surface 332" of dielectric layer structure 340. For example, the planarization process may be performed utilizing one or more of an etching process, a grinding process, and a polishing process. In some embodiments of the invention, the planarization process may be or include a chemical mechanical polishing (CMP) process. The CMP process conditions, such as the composition of the slurry abrasives and chemistry, may be chosen so that the surface 332' (FIG. 3D) of first dielectric layer 330 is further planarized, resulting in planar surface 332".

Planar surface 332" may go through further processing in order to obtain sufficient surface smoothness for achieving high bond strength with an attached semiconductor structure.

A plasma process may be utilized to further planarize the surface 332". In addition, such a plasma process may also "activate" the planar surface 332" by altering the surface chemistry in such a way that a bond strength to be attained between the planar surface 332" and another semiconductor structure to be subsequently attached thereto may be improved. By way of non-limiting example, plasma smoothing and activation of planar surface 332" of dielectric layer 330 may be performed by exposing semiconductor structure 340 to an oxygen plasma 346. Such a process is described in further detail in, for example, Choi et al., "The analysis of Oxygen Plasma Pretreatment for Improving Anodic Bonding," *Journal of Electrochemical Society,* 149 1 G8-G11 (2002).

In certain embodiments of the methods of the invention, planar surface 332" may have a root mean square (rms) surface roughness less than about 100 Å, less than about 10 Å, or even less than about 3 Å.

Figure 3F:
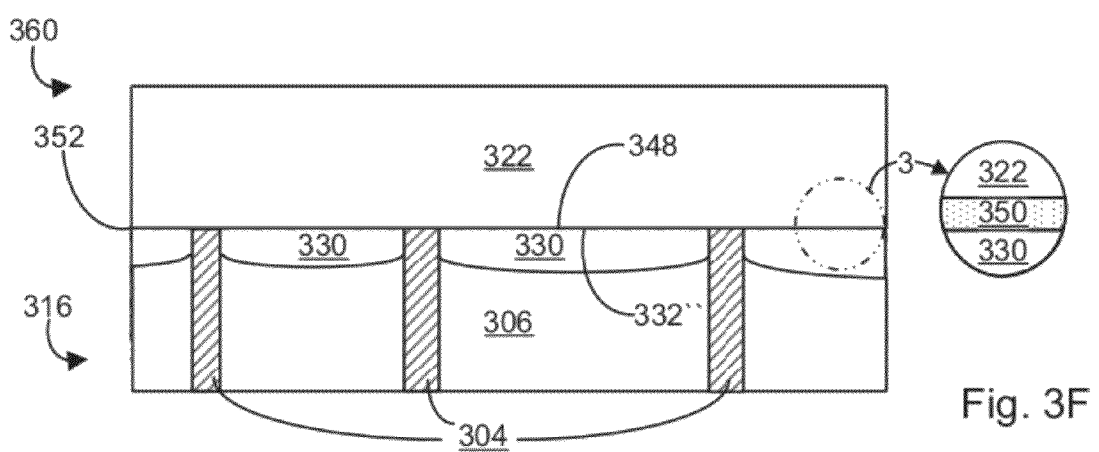

FIG. 3F illustrates a semiconductor structure 360 that may be formed by attaching another semiconductor structure 322 to the surface 332" of the dielectric layer 330 of the semiconductor structure 340 of FIG. 3E (or to the surface 332' of the dielectric layer 330 of the semiconductor structure 331 of FIG. 3D). The semiconductor structure 322 may include bonding surface 348, which may be bonded directly or indirectly to the surface 332" of the dielectric layer 330. In some embodiments of the invention, as shown in inset 3 of FIG. 3F, a bond-assisting layer 350 may be provided between the semiconductor structure 322 and the dielectric layer 330. Bond-assisting layer 350 may comprise any of a number of materials. In some embodiments, the bond-assisting layer 350 may comprise one or more dielectric materials such as, for example, one or more of silicon oxide, silicon nitride, and mixtures thereof. Furthermore, in some embodiments, the bond-assisting layer 350 may itself comprise a plurality of individual layers, which may have similar or different material compositions.

Semiconductor structure 322 may comprise any of a multitude of structures and materials. For example, semiconductor structure 322 may comprise at least one of a device structure and bonded structure.

In more detail, a semiconductor structure 322 may comprise at least a substantially homogenous layer of a single semiconductor material. Some such semiconductor structures include what are referred to in the art as free-standing substrates (FS-substrates). The homogeneous material may comprise, for example, elemental or compound materials, and may be conducting (e.g., metallic), semiconducting, or insulating. In some embodiments, the homogenous material may comprise one or more of silicon, germianium, silicon carbide, III-arsenides, III-phosphides, III-nitrides, III-antimonides, II-VI compounds, metals, metallic alloys, sapphire, quartz and zinc oxide. Furthermore, in some embodiments, the homogenous material may be at least substantially comprised by a single crystal of the homogenous material.

In additional embodiments of the invention, the semiconductor structure 322 may comprise a heterogeneous structure that includes a structure comprising two or more layers of differing materials. Such a heterogeneous semiconductor structure may include, for example, a template structure (such as, for example, a layer of semiconductor material) upon a base substrate. In such embodiments, the template structure and base substrate may comprise materials as mentioned previously. Further, the semiconductor structure may include two or more materials grown, deposited or placed on top of one another to form a layer stack. Again, such a semiconductor structure may include materials previously described above.

In further embodiments of the invention, the semiconductor structure 322 may comprise a device structure. A device structure may comprise active components, passive components and mixtures thereof. The device structure may comprise, for example, one or more of switching structures (e.g., transistors, etc.), light-emitting structures (e.g., laser diodes, light-emitting diodes, etc.), light-receiving structures (e.g., waveguides, splitters, mixers, photodiodes, solar cells, solar subcells, etc.), and microelectromechanical structures (e.g., accelerometers, pressure sensors, etc.). In some embodiments of the invention, semiconductor structure 322 may comprise a processed semiconductor structure that has been processed utilizing methods of the invention. For example, semiconductor structure 322 may comprise a semiconductor structure like the semiconductor structure 331 of FIG. 3D or the semiconductor structure 340 of FIG. 3E.

In yet further embodiments of the invention, the semiconductor structure 322 may comprise a bonded structure in which two or more elements are attached and bonded together. In some embodiments of the invention, the bonded structure may be fabricated utilizing embodiments of methods of the invention.

The bonding of semiconductor structure 322 and processed semiconductor structure 316 through dielectric layer 330 may be produced by molecular adhesion (i.e., bonding without the use of a glue, wax, solder, or other bonding agent). For example, bonding operations may require that bonding surface 332" and bonding surface 348 be sufficiently smooth, free of particles and contamination, and capable of being placed sufficiently close to one another to allow contact therebetween to be initiated (commonly at a distance of less than 5 nm). When brought into such proximity, the forces of attraction between bonding surface 332" and surface 348 can be sufficiently high to cause molecular adhesion (bonding induced by all of the forces of attraction (e.g., Van Der Waals forces) resulting from the electronic interactions between the atoms or the molecules of the two surfaces).

The initiation of the molecular adhesion can commonly be achieved by application of localized pressure, for example, using a TEFLON® stylus on an element in close contact with another element in order to trigger propagation of a bonding wave from the point of initiation. The term "bonding wave" refers to the front of the bonds or the molecular adhesion spreading from the point of initiation and corresponding to the dissemination of the forces of attraction from the point of initiation over the entire interface between bonding surface 332" and the bonding surface 348. For example, see the journal publications of Tong et al., *Materials, Chemistry and Physics* 37 101 1994, entitled "Semiconductor wafer bonding: recent developments," and Christiansen et al., *Proceedings of the IEEE* 94 12 2060 2006, entitled "Wafer Direct Bonding: From Advanced Substrate Engineering to Future Applications in Micro/Nanoelectronics."

Upon bonding of processed semiconductor structure 316 to semiconductor structure 322, further post-bonding treatments may be performed. For example, semiconductor structure 360 may be annealed at a temperature of between 100° C.-600° C. to increase the bond strength between processed semiconductor structure 316 and semiconductor structure 322. Increasing the bond strength between processed semiconductor structure 316 and semiconductor structure 322 may be performed to reduce the probability of unwanted separation of the semiconductor structure 322 from the processed semiconductor structure 316, such as might occur during subsequent processing.

Further processing of semiconductor structure 360 may comprise any of a multitude of further operations and procedures. For example, in some embodiments of the invention, semiconductor structure 322 may be thinned utilizing methods known in the art. In additional embodiments, structure 360 may be attached to one or more additional semiconductor structures. In additional embodiments of the invention, a plurality of devices may be fabricated on and/or in a surface of semiconductor structure 360 (e.g., on and/or in a surface of semiconductor structure 322), thus forming an additional processed semiconductor structure. One or more of the methods for further processing of semiconductor structure 360 may be performed one or more times and may also utilize embodiments of methods of the invention for producing smooth planar surfaces for attachment of additional semiconductor structures thereto.

Figure 4A:
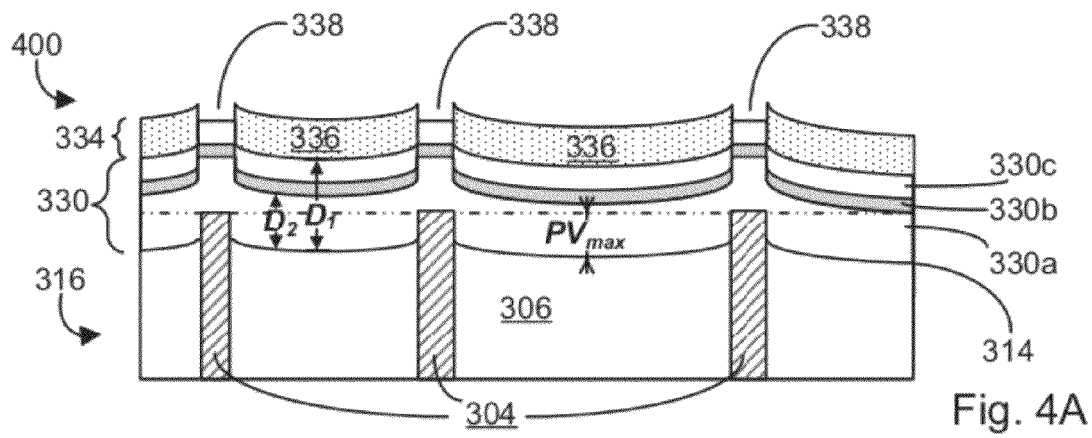
FIGS. 4A-4F schematically illustrate additional embodiments of the invention for fanning 3D integrated semiconductor structures.

Additional embodiments of the invention are now described with reference to FIGS. 4A-4F. These additional embodiments are similar to those previously described, except that, in the embodiments of FIGS. 4A-4F, the dielectric layer includes three or more layers. Therefore, for brevity, complete descriptions of the fabrication methods and the structural elements of semiconductor structure 400 of FIG. 4A are omitted here, as they have been previously described in reference to the semiconductor structure 320 of FIG. 3C. Differences relating to the dielectric layer 330 and subsequent planarizing and attachments methods are described in detail below. Also, elements of FIGS. 4A-4F that are closely similar to corresponding elements of FIGS. 3A-3F are identified with the same reference numbers.

Semiconductor structure 400 of FIG. 4A comprises non-planar surface 314 of processed semiconductor structure 316, dielectric layer 330 and etch masking layer 334. In some embodiments of the invention, dielectric layer 330 may comprise three or more layers of dielectric material. For example, as illustrated in FIG. 4A, dielectric layer 330 may comprise a first layer 330a, a second layer 330b, and a third layer 330c. Such a multilayer dielectric structure may assist in forming a dielectric layer 330 having a planar surface of sufficient planarity for attaining sufficient bond strength between the dielectric layer 330 and a semiconductor structure to be subsequently attached thereto.

Each of the layers 330a, 330b and 330c of dielectric material may comprise one or more materials, such as, for example, silicon oxides, silicon nitrides and mixtures thereof.

The second layer 330b of dielectric material may have a composition selected to enable the second layer 330b to be, and function as, an etch stop layer between the first layer 330a of dielectric material and the third layer 330c of dielectric material.

In addition, dielectric layer 330 (composed of all three layers 330a, 330b and 330c) may have an average total thickness $D_1$ greater than $PV_{max}$, as previously discussed in relation to FIG. 3B. However, in addition, the first layer 330a of the dielectric layer 330 may have an average layer thickness $D_2$ that is itself greater than $PV_{max}$, i.e., the average thickness $D_2$ of the first layer 330a may be greater than the maximum peak-to-valley distance of the non-planar surface 314. In certain embodiments of the invention, the second layer 330b (i.e., the etch stop layer) may have an average layer thickness of approximately greater than 100 nm, whereas the third layer 330c of dielectric material may have an average layer thickness of approximately greater than 100 nm.

In certain embodiments of the invention, the third layer 330c and the first layer 330a may be composed of essentially the same material (i.e., materials having at least substantially similar compositions). As a non-limiting example, the first layer 330a and the third layer 330c may comprise a silicon oxide (e.g., silicon dioxide), and the second layer 330b (the etch stop layer) may comprise a material different from that of each of the first layer 330a and the second layer 330c. As a non-limiting example, the second layer 330b may comprise a silicon nitride.

Dielectric layer 330 may be formed utilizing deposition methods previously discussed in relation to FIG. 3B. For example, the layers 330a, 330b and 330c of dielectric material may be formed utilizing plasma-assisted chemical vapor deposition at a temperature of less than about 400° C. The deposition sequence may be carried out such that the second layer 330b (the etch stop layer) is disposed between the first layer 330a of dielectric material and the third layer 330c of dielectric material, as illustrated in FIG. 4A.

Semiconductor structure 400 of FIG. 4A may also comprise a masking layer 334. As previously discussed, masking layer 334 may comprise a plurality of etch mask openings 338 that are aligned with and positioned directly over the plurality of conductive regions 304. In other words, the pattern of the etch mask openings 338 may at least substantially correspond to the pattern of the underlying plurality of conductive regions 304.

Figure 4B:
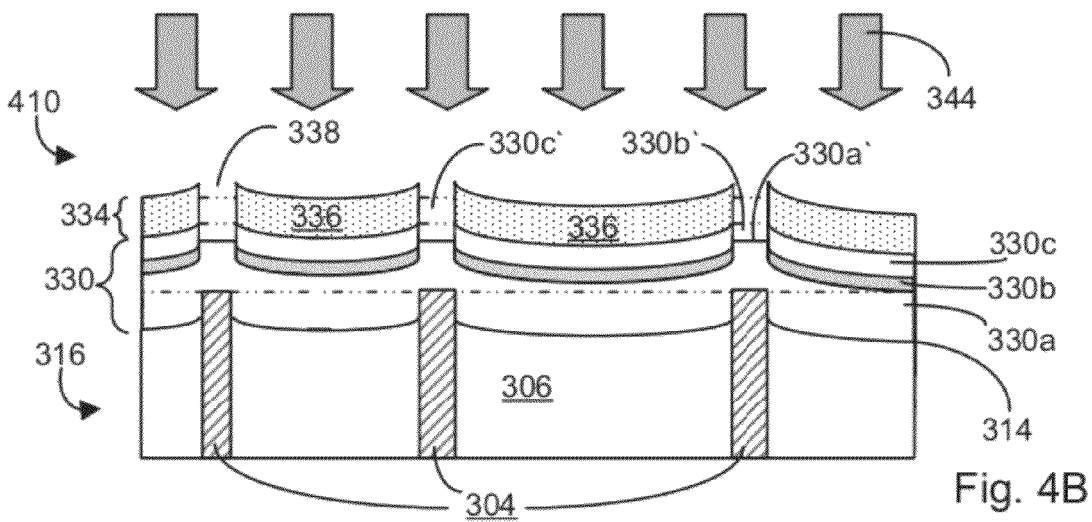

FIG. 4B illustrates a semiconductor structure 410 that may be formed by etching of regions of dielectric layer 330 exposed through the plurality of etch masking openings 338 in the etch masking layer 334. The etched portions of the dielectric layer 330 are illustrated in FIG. 4B in phantom.

In greater detail, portions of dielectric layer 330 may be removed, for example, using an etching process to assist in the planarization of the surface of the dielectric layer 330. For example, etching may be performed utilizing an isotropic or anisotropic plasma etching process, as illustrated by the arrows 344 of FIG. 4B. In certain embodiments, the plasma etching process may be performed by reactive ion etching or inductively coupled plasma etching.

The etching process may comprise selectively etching exposed portions 330c' of the third layer 330c until portions 330b' of the second layer 330b are exposed, and subsequently selectively etching exposed portions 330b' of the second layer 330b (the etch stop layer) until portions 330a' of the first layer 330a of dielectric material are exposed. The compositions of the layers 330a, 330b and 330c of dielectric material, as well as the etch chemistries, may be selected to allow the selective etching of the individual layers 330a, 330b and 330c of dielectric material (i.e., preferentially removing one layer while etching the underlying layer less significantly).

In certain embodiments of the invention, the first layer 330a of dielectric material and the third layer 330c of dielectric material may comprise a silicon oxide, and the second layer 330b (the etch stop layer) may comprise a silicon nitride. It is known in the art that silicon oxide may be plasma etched preferentially over silicon nitride, and vice versa, through the choice of etch process and etch chemistry. For a more detailed description of selective etch processes, see, for example, the publication of Van Roosmalen et al., 1991, entitled "Dry etching for VLSI," Plenum Press, New York. For wet chemistries, certain hydrofluoric acid (HF)-based etch solutions are known to etch silicon oxide selectively to silicon nitrides, whereas certain phosphoric acid ($H_3PO_4$)-based etch solutions are known to etch silicon nitride selectively to silicon oxides. Upon the removal of the selected exposed portions of the dielectric layer 330, the remaining portions of the etch masking layer 334 may be removed using methods known in the art.

Figure 4C:
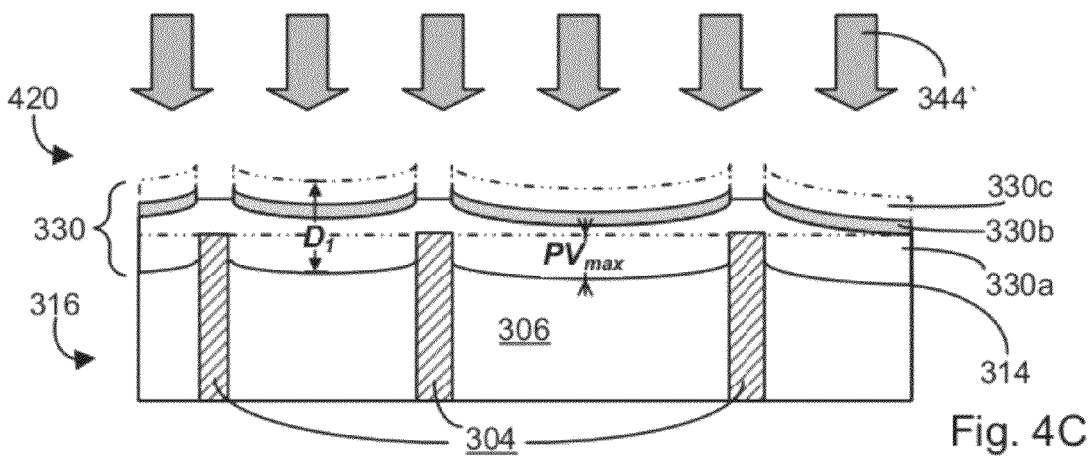

FIG. 4C illustrates a semiconductor structure 420 that may be formed by polishing through the thickness of the third layer 330c of dielectric material until the remaining second layer 330b (the etch stop layer) is exposed. In certain embodiments, the polishing of the third layer 330c of dielectric material may be performed utilizing a chemical mechanical polishing (CMP) process. The CMP process conditions, including the compositions of the slurry abrasives and chemistry, may be chosen as known in the art so that the third layer 330c of dielectric material may be removed selectively, resulting in the exposure of the second layer 330b.

Upon polishing through the thickness of the third layer 330c until the second layer 330b (the etch stop layer) is exposed, remaining portions of the second layer 330b may also be removed, for example, by utilizing a selective etching process. In certain embodiments of the invention, the second layer 330b may be selectively etched by a plasma etching process, as indicated by the arrows 344' in FIG. 4C. Such a plasma etching process may include, for example, a selective reactive ion etching process or an inductively coupled plasma etching process, as previously outlined. As previously mentioned, the second layer 330b (the etch stop layer) may comprise a silicon nitride, whereas the first layer 330a of dielectric material may comprise a silicon oxide. Therefore, the plasma etch process utilized to remove the second layer 330b may be selective to silicon nitride over silicon oxide, such that the silicon nitride material of the second layer 330b is preferentially removed over the silicon oxide material of first layer 330a of dielectric material.

Figure 4D:
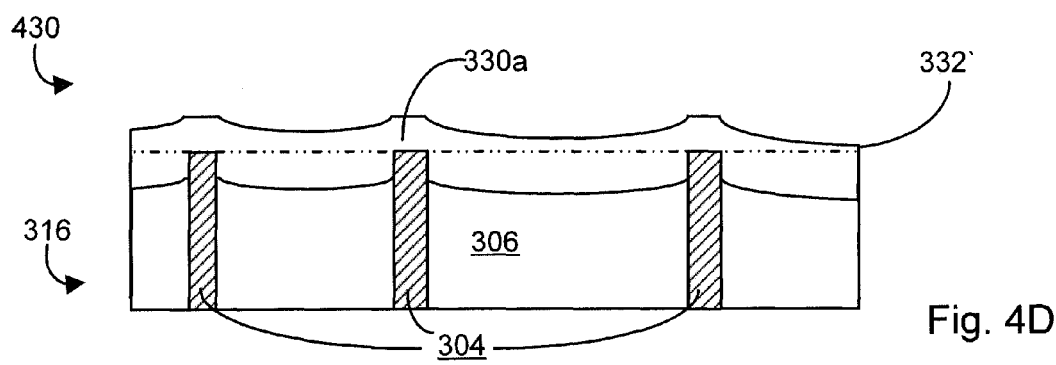
Figure 4E:
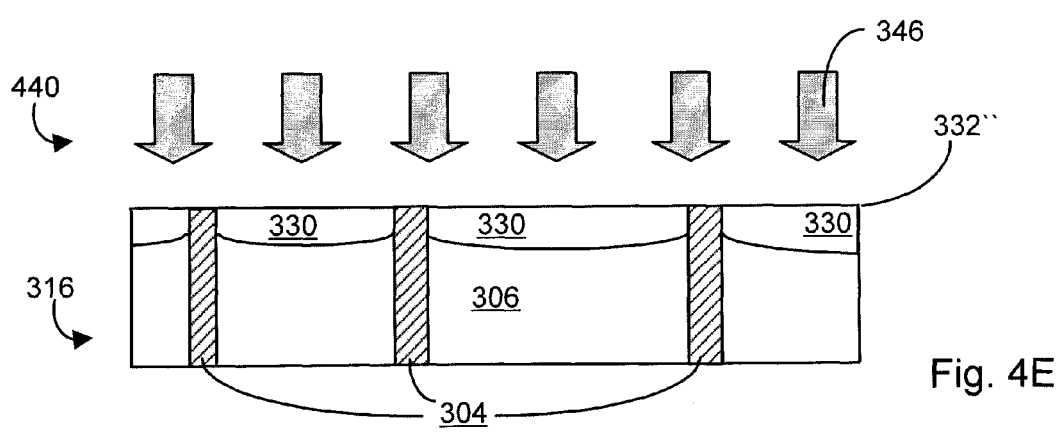
Figure 4F:
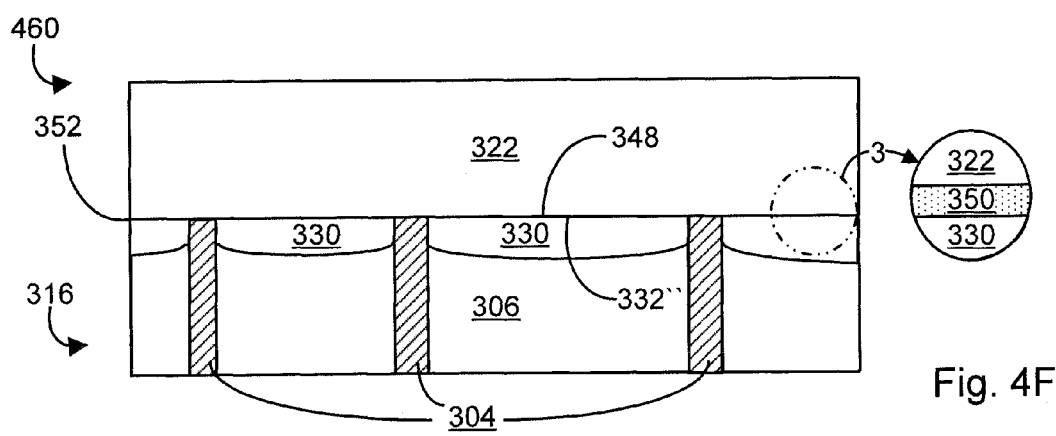

Subsequent processing, as illustrated in FIGS. 4D-4F, may proceed in a manner similar to that previously described with reference to FIGS. 3D-3F. Briefly, FIG. 4D illustrates a semiconductor structure 430 that may be formed by polishing through the thickness of the remaining third layer 330c of dielectric material until the second layer 330b (the etch stop layer) is exposed, and subsequently selectively etching the remaining second layer 330b until the first layer 330a of dielectric material (which may be substantially similar to the dielectric layer 330 of FIG. 3D) is exposed. FIG. 4E illustrates a semiconductor structure 440 that may be formed from the semiconductor structure 430 of FIG. 4D by further planarizing the surface 332' of the first layer 330a of dielectric material to produce a further planarized dielectric surface 332". Further processes, including plasma smoothing and activation, as illustrated by the arrows 346 in FIG. 4E, may be performed to achieve the desired surface chemistry and smoothness of planar surface 332". As shown in FIG. 4F, a semiconductor structure 460 may be formed by attaching (e.g., bonding) another semiconductor structure 322 to semiconductor structure 316, as described in detail above with reference to FIG. 3F.

Examples

Non-limiting examples are now described to illustrate particular embodiments of the invention. It should be understood that, in the following examples, parameters, materials, structures, etc., are provided for illustrative purposes only, and do not limit embodiments of the present invention.

With reference to FIG. 3A, processed semiconductor structure 316 is provided, which comprises a complementary metal-oxide-semiconductor device substrate 306 comprising a plurality of device structures including, amongst other devices, field effect transistors. The conducting regions 304 comprise a barrier material, such as, for example, tantalum, as well as electrode material comprising, for example, copper. The plurality of eroded regions 312 are formed by a CMP used to remove a portion 316' of processed semiconductor structure 316 (as shown in phantom in FIG. 3A).

With reference to FIG. 3B, dielectric layer 330 is deposited conformally over non-planar surface 314. Dielectric layer 330 comprises silicon dioxide ($SiO_2$) deposited by plasma-enhanced chemical vapor deposition (PECVD) at a temperature of between 150° C. and 400° C. The precursors for the PECVD deposition may include silane ($SiH_4$), tetraethyl orthosilicate (TEOS), oxygen ($O_2$), hydrogen ($H_2$) and nitrous oxide ($N_2O$). The average thickness $D_1$ of the dielectric layer 330 is greater than the maximum peak-to-valley distance $PV_{max}$ of the non-planar surface 314. $D_1$ may be greater than about 100 nm in some embodiments of the invention. In additional embodiments of the invention, $D_1$ may be greater than about 1 µm.

With reference to FIG. 3C, dielectric layer 330 is coated with an etch masking layer 334 comprising a positive contrast photosensitive polymer. The etch masking layer 334 is patterned using a photolithographic mask patterned with the negative image of the pattern of the plurality of conductive regions 304. Upon light exposure and development, the plurality of mask openings 338 are formed directly over the plurality of conductive regions 304. Subsequently, the portions of dielectric layer 330 exposed through the mask openings 338 are exposed to a fluorine-based etch plasma 344 in a reactive ion etching process to remove portions of the dielectric layer 330 exposed through the mask openings 338. The etch masking layer 334 then may be removed.

With reference to FIG. 3D, the surface 332' of dielectric layer 330 is polished by a CMP process to provide the further planarized surface 332" of FIG. 3E. In addition to the CMP polishing process, the surface 332" of the dielectric layer 330 is exposed to an oxygen plasma to provide the surface 332" with an rms roughness suitable for subsequent attachment to a semiconductor structure. The plasma smoothing process may be performed by placing semiconductor structure 340 within a reactive ion etcher (RIE) and subjecting surface 332" to an oxygen plasma. The RIE chamber may be set to pressure of approximately 50 mTorr, while oxygen gas may be utilized as a source of oxygen. The flow rate of the oxygen into the RIE chamber may be approximately 30 sccm. The plasma self bias may be varied between −60 V to −360 V.

With reference to FIG. 3F, the semiconductor structure 322 comprises a silicon substrate that includes a bond-assisting layer 350 comprising silicon dioxide ($SiO_2$). The silicon substrate 322 with $SiO_2$ bond-assisting layer 350 is brought into intimate contact with the surface 332" of the semiconductor structure 340 (FIG. 3E). Bonding interface 352 is produced between the $SiO_2$ bond-assisting layer 350 and the bonding surface 332" of the dielectric layer 330.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims. Headings and legends are used herein for clarity and convenience only.

What is claimed is:

1. A method for forming a semiconductor structure, comprising:
   forming a dielectric layer over a non-planar surface of a processed semiconductor structure, the non-planar surface comprising a plurality of conductive regions and a plurality of non-conductive regions;
   forming a masking layer over the dielectric layer and providing a plurality of mask openings extending through the masking layer directly over at least some of the conductive regions of the plurality of conductive regions of the non-planar surface of the processed semiconductor structure;
   planarizing a surface of the dielectric layer on a side thereof opposite the non-planar surface of the processed semiconductor structure to form a planarized surface comprising a plurality of conductive regions and a plurality of non-conductive regions, wherein planarizing the surface of the dielectric layer comprises:
      etching regions of the dielectric layer exposed through the plurality of mask openings extending through the masking layer; and
      polishing the surface of the dielectric layer after the etching of the regions of the dielectric layer; and
   attaching a semiconductor structure to the planarized surface of the dielectric layer.

2. The method of claim 1, further comprising polishing a surface of the processed semiconductor structure to form the non-planar surface of the processed semiconductor structure.

3. The method of claim 1, wherein forming the dielectric layer further comprises depositing one or more layers of at least one of silicon oxide, silicon nitride, and mixtures thereof over the non-planar surface of the processed semiconductor structure.

4. The method of claim 1, wherein forming the dielectric layer further comprises:
   providing a first dielectric material over the non-planar surface of the processed semiconductor structure;
   providing an etch stop layer over the first dielectric material on a side thereof opposite the processed semiconductor structure; and
   providing a second dielectric material over the etch stop layer on a side thereof opposite the etch stop layer.

5. The method of claim 4, wherein etching regions of the dielectric layer exposed through the plurality of mask openings further comprises:
   selectively etching exposed portions of the second dielectric material and exposing portions of the etch stop layer; and
   selectively etching exposed portions of the etch stop layer and exposing portions of the first dielectric material.

6. The method of claim 4, wherein planarizing the dielectric layer to form the planarized surface further comprises:
   polishing through a remaining portion of the second dielectric material and exposing a remaining portion of the etch stop layer; and
   selectively etching the remaining portion of the etch stop layer.

7. The method of claim 4, wherein polishing the surface of the dielectric layer comprises polishing a surface of the first dielectric material.

8. The method of claim 1, wherein forming the dielectric layer comprises depositing the dielectric layer using a plasma-assisted chemical vapor deposition process at a temperature of less than about 400° C.

9. The method of claim 1, wherein forming the dielectric layer further comprises selecting the dielectric layer to have an average layer thickness greater than a maximum peak-to-valley value of the non-planar surface of the processed semiconductor structure.

10. The method of claim 1, wherein etching regions of the dielectric layer comprises etching the regions of the dielectric layer using a plasma etching process.

11. The method of claim 1, wherein polishing the surface of the dielectric layer comprises chemical mechanical polishing the surface of the dielectric layer.

12. The method of claim 1, wherein attaching a semiconductor structure to the planarized surface of the dielectric layer further comprises molecular bonding the semiconductor structure directly to the planarized surface of the dielectric layer.

13. The method of claim 1, wherein forming the masking layer further comprises patterning the plurality of mask openings to at least substantially correspond to a pattern of the plurality of conductive regions of the non-planar surface of the processed semiconductor structure.

14. The method of claim 13, further comprising polishing a surface of the processed semiconductor structure to form the non-planar surface of the processed semiconductor structure.

15. The method of claim 14, wherein forming the dielectric layer further comprises depositing one or more layers of at least one of silicon oxide, silicon nitride, and mixtures thereof over the non-planar surface of the processed semiconductor structure.

16. The method of claim 13, wherein forming the dielectric layer further comprises depositing one or more layers of at least one of silicon oxide, silicon nitride, and mixtures thereof over the non-planar surface of the processed semiconductor structure.

17. The method of claim 13, wherein forming the dielectric layer further comprises:
   providing a first dielectric material over the non-planar surface of the processed semiconductor structure;
   providing an etch stop layer over the first dielectric material on a side thereof opposite the processed semiconductor structure; and
   providing a second dielectric material over the etch stop layer on a side thereof opposite the etch stop layer.

18. The method of claim 13, wherein forming the dielectric layer further comprises selecting the dielectric layer to have an average layer thickness greater than a maximum peak-to-valley value of the non-planar surface of the processed semiconductor structure.

19. The method of claim 13, wherein attaching a semiconductor structure to the planarized surface of the dielectric layer further comprises molecular bonding the semiconductor structure directly to the planarized surface of the dielectric layer.

* * * * *